(12) United States Patent
Park

(10) Patent No.: US 8,194,449 B2
(45) Date of Patent: Jun. 5, 2012

(54) MEMORY DEVICE AND OPERATING METHOD

(75) Inventor: Ki Tae Park, Seongnam-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 273 days.

(21) Appl. No.: 12/647,583

(22) Filed: Dec. 28, 2009

(65) Prior Publication Data
US 2010/0165731 A1    Jul. 1, 2010

(30) Foreign Application Priority Data
Dec. 29, 2008    (KR) .................. 10-2008-0135452

(51) Int. Cl.
*G11C 16/04*    (2006.01)
(52) U.S. Cl. .......... 365/185.03; 365/185.18; 365/189.07
(58) Field of Classification Search ............. 365/185.03, 365/185.18, 185.22, 185.24, 185.26, 185.28, 365/189.07
See application file for complete search history.

(56) References Cited

U.S. PATENT DOCUMENTS

| 6,055,181 | A | 4/2000 | Tanaka et al. | |
| 6,522,580 | B2 | 2/2003 | Chen et al. | |
| 7,099,204 | B1* | 8/2006 | Wadhwa et al. | 365/189.09 |
| 7,113,431 | B1* | 9/2006 | Hamilton et al. | 365/185.29 |
| 7,619,932 | B2* | 11/2009 | Jones et al. | 365/185.22 |
| 7,656,705 | B2* | 2/2010 | Hamilton et al. | 365/185.03 |

FOREIGN PATENT DOCUMENTS
KR    1020000005160 A    1/2000
* cited by examiner

*Primary Examiner* — Gene Auduong
(74) *Attorney, Agent, or Firm* — Volentine & Whitt, PLLC

(57) ABSTRACT

A method of operating a memory device includes; defining a plurality of read levels, using the plurality of read levels to determine electrical property differences between first and second memory cells adjacent dispose along a common word line, and determining read data stored in the first and second memory cells in relation to the determination of electrical property differences between the first and second memory cells.

10 Claims, 9 Drawing Sheets

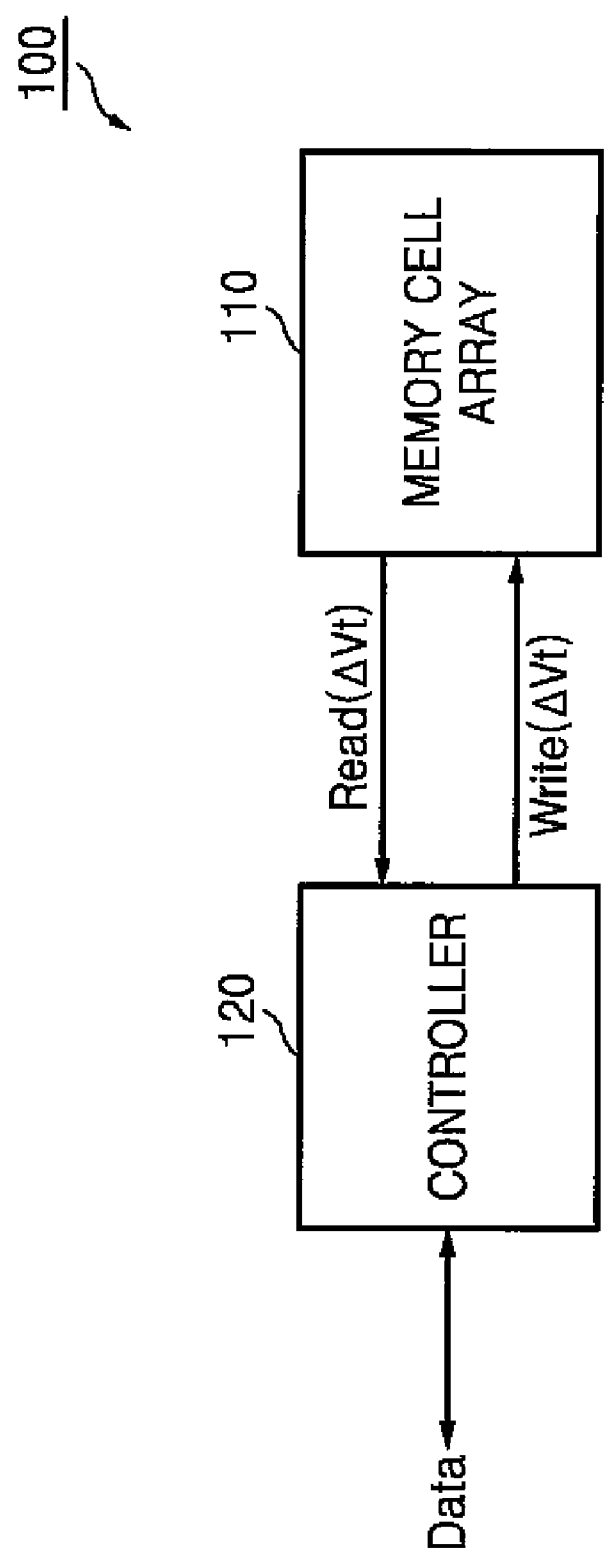

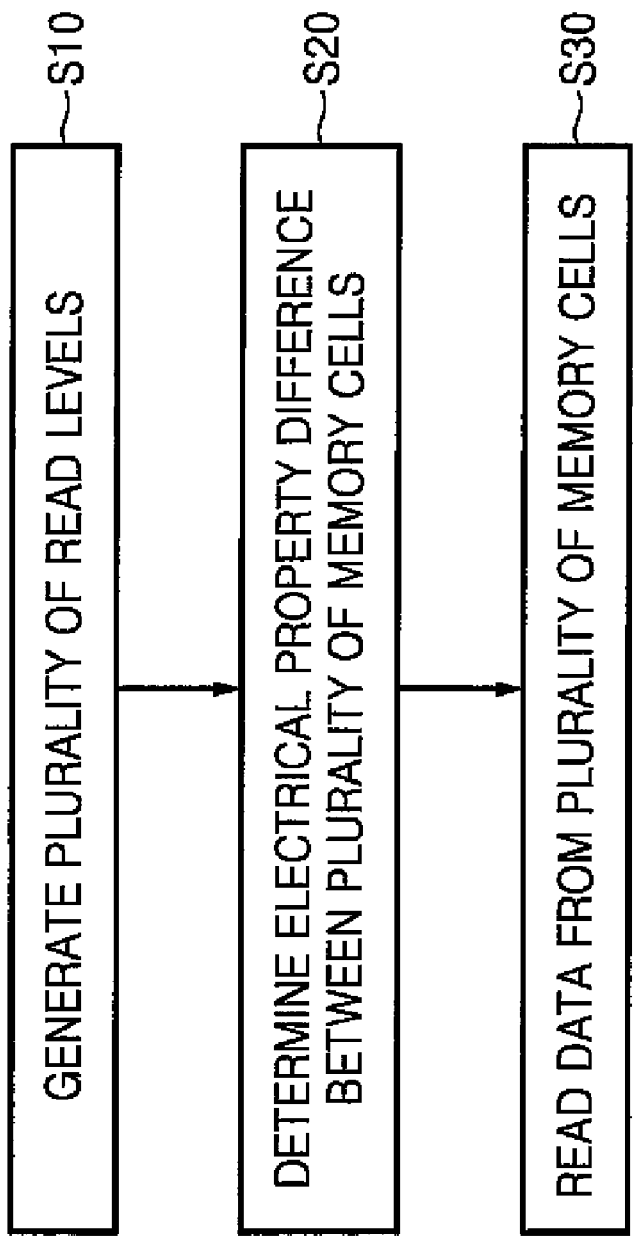

FIG. 6

| DETECTED STATE {R1, R2, R3} | DETERMINATION | DATA READING |
|---|---|---|
| $\{-0, -0, -0\}$ $\{+0, +0, +0\}$ | A=B | 00 OR 11 |
| $\{-\Delta Vt1, -\Delta Vt2, -\Delta Vt3\}$ $\{-\Delta Vt1, -0, -0\}$ $\{-0, -\Delta Vt2, -0\}$ $\{-0, -0, -\Delta Vt3\}$ | A<B | 01 OR 10 |
| $\{+\Delta Vt1, +\Delta Vt2, +\Delta Vt3\}$ $\{+\Delta Vt1, +0, +0\}$ $\{+0, +\Delta Vt2, +0\}$ $\{+0, +0, +\Delta Vt3\}$ | A>B | |

FIG. 9

| DATA READING | DETERMINATION | | DETECTED STATE |
|---|---|---|---|
| 1111 | A | A | R1{A, A} |
| 1110 | A | B | R1{A, G1} & R2{G2, G2} |
| 1101 | A | C | R1{A, G1} & R2{G2, G4} & R3{G4, G4} |
| 1100 | A | D | R1{A, G1} & R2{G2, G4} & R3{G4, D} |
| 1011 | B | A | R1{G1, A} & R2{G2, G2} |
| 1010 | B | B | R1{G1, G1} & R2{G2, G2} |
| 1001 | B | C | R1{G1, G1} & R2{G2, G3} & R3{G4, G4} |
| 1000 | B | D | R1{G1, G1} & R2{G2, G3} & R3{G4, D} |
| 0111 | C | A | R1{G1, A} & R2{G3, G2} & R3{G4, G4} |
| 0110 | C | B | R1{G1, G1} & R2{G3, G2} & R3{G4, G4} |
| 0101 | C | C | R2{G3, G3} & R3{G4, G4} |
| 0100 | C | D | R2{G3, G3} & R3{G4, D} |
| 0011 | D | A | R1{G1, A} & R2{G3, G2} & R3{D, G4} |
| 0001 | D | B | R1{G1, G1} & R2{G3, G2} & R3{D, G4} |
| 0010 | D | C | R2{G3, G3} & R3{D, G4} |
| 0000 | D | D | R3{D, D} |

MEMORY DEVICE AND OPERATING METHOD

CROSS-REFERENCE TO RELATED APPLICATION

This application claims priority under 35 U.S.C. §119 to Korean Patent Application No. 10-2008-0135452 filed on Dec. 29, 2008, the subject matter of which is hereby incorporated by reference.

BACKGROUND

The present inventive concept relates to memory devices and related methods of operation. More particularly, the inventive concept relates to methods of operating memory devices by which read errors arising during read operations are reduced.

A NAND flash memory includes memory cells serially connected between a drain selection transistor and a source selection transistor. The number of serially connected memory cells may vary according to the type of the device, the integration density of the memory cells, and other factors.

In conventional NAND flash memory devices, a memory cell may be placed into one of two data states (i.e., programmed) in accordance with corresponding threshold voltage distributions. During a subsequent read operation applied to the memory cell, a single read voltage level is defined between the two threshold voltage distributions, and may be used to discriminate the programmed state of the memory cell. However, in the conventional NAND flash memory devices, coupling due to a parasitic capacitance occurs in each of a plurality of adjacent memory cells arranged along a connecting bit line. The effect of this parasitic capacitance tends to increase the threshold voltage of programmed memory cells. Consequently, accurately discriminating the programmed data state of a memory cell influenced by the parasitic capacitance becomes more difficult, as threshold voltages shift and may ultimately overlap. This is particularly true when a single read voltage level is used, and read errors may arise as a result.

SUMMARY

Embodiments of the inventive concept provide a method of operating a memory device by which read errors potentially arising during a read operation are reduced.

According to an aspect of the present inventive concept, there is provided a method of operating a memory device, the method comprising; defining a plurality of read levels, using the plurality of read levels to determine electrical property differences between first and second memory cells adjacent disposed along a common word line, and determining read data stored in the first and second memory cells in relation to the determination of electrical property differences between the first and second memory cells.

In a related aspect, the first memory cell may be programmed to a first threshold distribution and the second memory cell may be programmed to a second threshold distribution different from the first threshold distribution, wherein determining the electrical property difference between the first and second memory cells comprises; determining a voltage difference between the first threshold distribution and the second threshold distribution, and comparing at least one of the plurality of read levels to the voltage difference to determine the read data stored in at least one of the first and second memory cells.

According to another aspect of the inventive concept, there is provided a method of operating a memory device, the method comprising; defining a read level, using the read level to determine electrical property differences between first and second memory cells adjacent disposed along a common word line, and determining read data stored in the first and second memory cells in relation to the determination of electrical property differences between the first and second memory cells.

According to yet another aspect of the inventive concept, there is provided a memory device comprising; a memory cell array including first and second memory cells arranged adjacent to one another along a common word line, and a controller configured to apply a read operation to the first and second memory cells by defining a plurality of read levels, using the plurality of read levels to determine electrical property differences between the first and second memory cells, and determining read data stored in the first and second memory cells in relation to the determination of electrical property differences between the first and second memory cells.

BRIEF DESCRIPTION OF THE DRAWINGS

Exemplary embodiments of the inventive concept will be more clearly understood from the following detailed description taken in conjunction with the accompanying drawings in which:

FIG. 1 is a schematic block diagram of a memory device according to an embodiment of the inventive concept;

FIG. 2 is a flowchart summarizing a general read operation applied to the memory device of FIG. 1;

FIG. 6 is a table summarizing data determination conditions according to the diagrams of FIGS. 3A-3D, 4A-4D, and 5A-5B;

FIG. 9 is a table summarizing data determination conditions according to the diagrams illustrated in FIG. 8.

DETAILED DESCRIPTION OF EMBODIMENTS

Figure 3A:
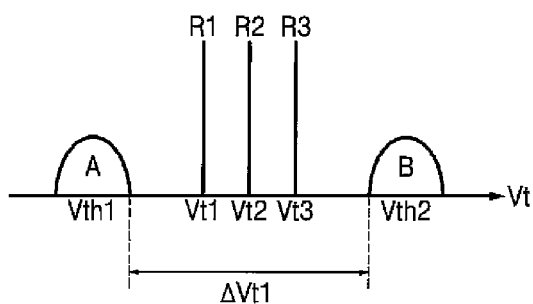
FIGS. 3A-3D, 4A-4D, and 5A-5B are diagrams illustrating various read operations applied to the memory device of FIG. 1 in accordance with the method summarized in FIG. 2.

FIG. 1 is a schematic block diagram of a memory device 100 according to an embodiment of the inventive concept. Referring to FIG. 1, the memory device 100 comprises a memory cell array 110 and a controller 120. Although not shown in FIG. 1, the memory cell array 110 may further comprise a page buffer and a decoder.

The memory cell array 110 comprises a plurality of memory cells (not shown). For example, the memory cell array 110 may include a plurality of memory cells arranged in a matrix of rows and columns, and each of the plurality of memory cells may be connected to the decoder. Each of the plurality of memory cells may be implemented into a Single Level Cell (SLC) or a Multi Level Cell (MLC).

The controller 120 writes (or programs) write data (Data) received from an external source to each of the plurality of memory cells of the memory cell array 110, or obtains read data from each of the plurality of memory cells. The controller 120 may perform a program or read operation in relation to each one of the plurality of memory cells in the memory cell array 110. That is, the controller 120 may program write data (Data) received from the external source to each of the plurality of memory cells according to the characteristics of the write data, or obtain read data from each of the plurality of memory cells according to the characteristics of the read data.

In other words, the controller 120 may perform a program operation in relation to each of the plurality of memory cells according to an electrical property difference $\Delta Vt$ of the write data. For example, N-bit write data, where N is a natural number greater than 1, is assumed in certain embodiments of the inventive concept. Thus, assuming 2-bit write data having a value of '01' is received from the external source in the controller 120, the controller 120 will proceed to program the received 2-bit write data into one of the plurality of memory cells in accordance with the electrical property difference of the 2-bit write data (generically designated $\Delta Vt$ in FIG. 1, but may include a data value difference, a voltage difference indicative of a data value, a current difference indicative of a data value, a resistance value indicative of a data value, etc.).

In similar manner, the controller 120 may obtain (or "determine") designated read data stored in one of the plurality of memory cells. For example, the controller 120 may use different read voltages having different levels to determine a certain characteristic of the stored read data stored in one of the plurality of memory cells (e.g., the data value, a voltage difference indicative of the data value, a current difference indicative of the data value, a resistance value indicative of the data value, etc.). These approaches will be described in some additional detail with reference to FIGS. 2 through 9.

FIG. 2 is a flowchart summarizing a read operation applied to the memory device 100 illustrated in FIG. 1 according to certain embodiments of the inventive concept. FIGS. 3A-3D, 4A-4D, and 5A-5B are diagrams illustrating read operations applied to the memory device 100 according to the method summarized in FIG. 2. FIG. 6 is a table summarizing data determination conditions according to the diagrams of FIGS. 3A-3D, 4A-4D, and 5A-5B. Referring to FIGS. 1 and 2, the controller 120 of the memory device 100 generates a plurality of read voltages having different levels (hereafter "read levels") in order to determine read data stored in the plurality of memory cells (S10).

Referring to FIGS. 3A-3D, 4A-4D, and 5A-5B, the plurality of read levels (i.e., first, second, and third read levels R1, R2, and R3 for the illustrated example) is generated by the controller 120. In the illustrated example, the first read level R1 has a first level Vt1, the second read level R2 has a second level Vt2 greater than Vt1, and the third read level R3 has a third level Vt3 greater than Vt2. As noted above, voltage levels Vt1, Vt2, and Vt3 are used in the illustrated embodiments, but those skilled in the art will understand that different current values, or different resistance values, might be used in relation to other embodiments of the inventive concept.

Referring again to FIGS. 1 and 2, the controller 120 next determines an electrical property difference between the read data stored in a plurality of memory cells, (e.g., at least two memory cells adjacent to each other along the same word line in the memory cell array 110) using the plurality of read levels (e.g., the first, second, and third read levels R1, R2, and R3) (S20). Then, the controller 120 reads the read data stored in each one of the plurality of memory cells according to the determination result (S30).

For example, referring to FIGS. 1 and 3A-3D, a pair of memory cells (first cell A and second cell B) within the memory cell array 110 of the memory device 100 is arranged adjacent to each other along the same word line. Each one of the pair of memory cells respectively stores data in accordance with a defined threshold voltage distribution. For example, the first cell A is assumed to store data having a first distribution Vth1, and the second cell B is assumed to store data having a second distribution Vth2.

In FIG. 3A, the plurality of read levels, namely, the first, second, and third read levels R1, R2, and R3, generated by the controller 120 exist between the first distribution Vth1 of the first cell A and the second distribution Vth2 of the second cell B. Thus, the first distribution Vth1 and the second distribution Vth2 may be determined to not overlap as indicated by the relative values of the first read level R1, second read level R2, and third read level R3 as compared with a first voltage difference $\Delta Vt1$ between first distribution Vth1 and the second distribution Vth2.

Thus, in the condition illustrated in FIG. 3A, the first and second distributions Vth1 and Vth2 for the first and second cells A and B are separated by the first voltage difference $\Delta Vt1$ which "captures" or includes all three of the first levels, the second read level being roughly centered there between, and the first and third read levels being arranged to either side, above and below the second read level.

Figure 3B:
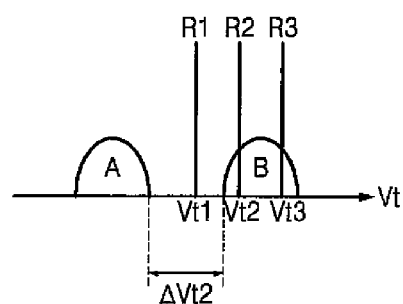

In the condition illustrated in FIG. 3B, the second distribution Vth2 of the second cell B is assumed to be significantly shifted towards the first distribution Vth1. Thus, a resulting second voltage difference $\Delta Vt2$ separating the first and second distributions Vth1 and Vth2 for the first and second cells A and B is significantly less than the first voltage difference $\Delta Vt1$. As a result, only the first read level R1 is captured within the second voltage difference $\Delta Vt2$, while the second and third read levels R2 and R3 are "outside" or "above" the second voltage difference $\Delta Vt2$ (i.e., above a lower limit defined for the second distribution Vth2).

Figure 3C:
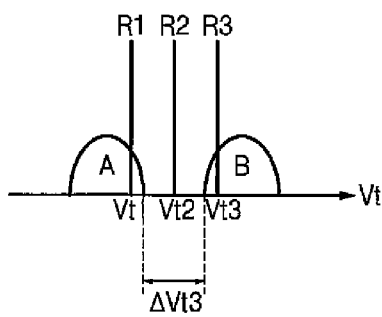

In the condition illustrated in FIG. 3C, both the first distribution Vth1 of the first cell A and the second distribution Vth2 of the second cell B have shifted towards one another and defining a small third voltage difference $\Delta Vt3$. As a result, only the second read level R2 is captured within the voltage difference $\Delta Vt3$, while the first read level R1 is outside or "below" the third voltage difference $\Delta Vt3$ (i.e., below an upper limit defined for the first distribution Vth1) and the third read level R3 is outside or above the third voltage difference $\Delta Vt3$ (i.e., above the limit defined for the second distribution Vth2).

Figure 3D:
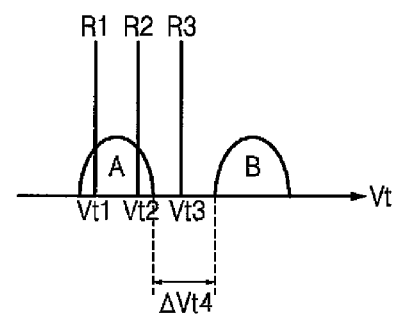

Finally, in the condition illustrated in FIG. 3D, the first distribution Vth1 of the first cell B is assumed to be significantly shifted towards the second distribution Vth2. Thus, a resulting fourth voltage difference $\Delta Vt4$ separating the first and second distributions Vth1 and Vth2 for the first and second cells A and B is significantly less than the first voltage difference $\Delta Vt1$. As a result, only the third read level R3 is captured within the fourth voltage difference $\Delta Vt4$, while the first and second read levels R1 and R2 are outside or below the fourth voltage difference $\Delta Vt4$ (i.e., below the upper limit defined for the first distribution Vth1).

Referring now to FIG. 6, the controller 120 may detect the first distribution Vth1 of the first cell A as $\{-\Delta Vt1, -\Delta Vt2, -\Delta Vt3\}$ in FIG. 3A, as $\{-\Delta Vt1, -0, -0\}$ in FIG. 3B, as $\{-0, -\Delta Vt2, -0\}$ in FIG. 3C, and as $\{-0, -0, -\Delta Vt3\}$ in FIG. 3D. Accordingly, the controller 120 may determine that the first distribution Vth1 of the first cell A has a lower voltage range than that of the second distribution Vth2 of the second cell B. That is, the controller 120 may determine a threshold voltage relationship of A<B, and may read data values having different levels, (e.g., data values of 01 or 10) from the first cell A and the second cell B, respectively.

Referring to FIGS. 1, 3A, 3B, 3C, and 3D, data having certain threshold voltage distributions may be stored in a plurality of memory cells of the memory device 100, for example, a pair of memory cells arranged adjacent to each other along the same word line (e.g., the first cell A and second cell B). For example, the first cell A may store data having the first distribution Vth1, and the second cell B may store data having the second distribution Vth2.

FIGS. 4A-4D illustrate the opposite condition between first cell A and second cell B. That is, the first cell A is programmed with the second threshold Vth2 and the second cell B is programmed with the first threshold Vth1. Here again, the same plurality of read levels, namely, the first, second, and third read levels R1, R2, and R3, generated by the controller 120 may be used to identify programming conditions between the first distribution Vth1 of the second cell B and the second distribution Vth2 of the first cell A.

Figure 4A:
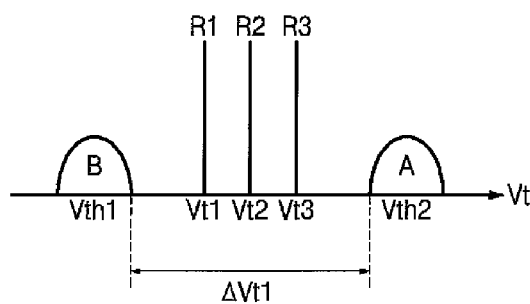

In FIG. 4A, the plurality of read levels, namely, the first, second, and third read levels R1, R2, and R3, generated by the controller 120 exist between the first distribution Vth1 of the second cell B and the second distribution Vth2 of the first cell A. Thus, the first distribution Vth1 and the second distribution Vth2 may be determined to not overlap as indicated by the relative values of the first read level R1, second read level R2, and third read level R3 as compared with a first voltage difference $\Delta$Vt1 between first distribution Vth1 and the second distribution Vth2.

Thus, in the condition illustrated in FIG. 3A, the first and second distributions Vth1 and Vth2 for the second and first cells B and A are separated by the first voltage difference $\Delta$Vt1 which captures or includes all three of the first levels, the second read level being roughly centered there between, and the first and third read levels being arranged to either side, above and below the second read level.

Figure 4B:
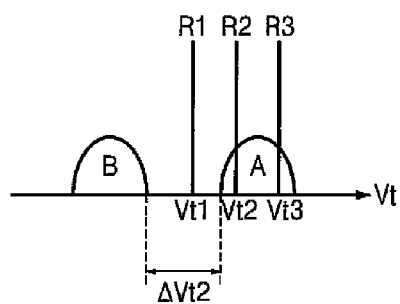

In the condition illustrated in FIG. 4B, the second distribution Vth2 of the first cell A is assumed to be significantly shifted towards the first distribution Vth1. Thus, a resulting second voltage difference $\Delta$Vt2 separating the first and second distributions Vth1 and Vth2 for the second and first cells B and A is significantly less than the first voltage difference $\Delta$Vt1. As a result, only the first read level R1 is captured within the second voltage difference $\Delta$Vt2, while the second and third read levels R2 and R3 are outside or above the second voltage difference $\Delta$Vt2 (i.e., above a lower limit defined for the second distribution Vth2).

Figure 4C:
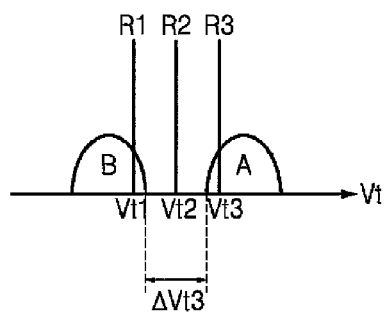

In the condition illustrated in FIG. 4C, both the first distribution Vth1 of the second cell B and the second distribution Vth2 of the first cell A have shifted towards one another defining a third voltage difference $\Delta$Vt3. As a result, only the second read level R2 is captured within the voltage difference $\Delta$Vt3, while the first read level R1 is outside or below the third voltage difference $\Delta$Vt3 (i.e., below an upper limit defined for the first distribution Vth1) and the third read level R3 is outside or above the third voltage difference $\Delta$Vt3 (i.e., above the limit defined for the second distribution Vth2).

Finally, in the condition illustrated in FIG. 3D, the first distribution Vth1 of the second cell B is assumed to be significantly shifted towards the second distribution Vth2. Thus, a resulting fourth voltage difference $\Delta$Vt4 separating the first and second distributions Vth1 and Vth2 for the second and first cells B and A is significantly less than the first voltage difference $\Delta$Vt1. As a result, only the third read level R3 is captured within the fourth voltage difference $\Delta$Vt4, while the first and second read levels R1 and R2 are outside or below the fourth voltage difference $\Delta$Vt4 (i.e., below the upper limit defined for the first distribution Vth1).

Figure 4D:
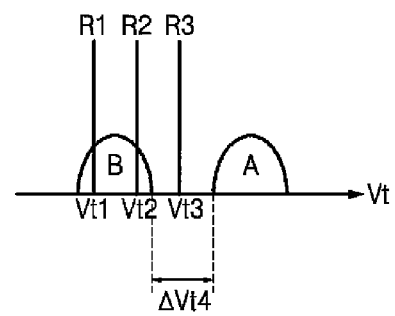

Referring to FIG. 6, the controller 120 may detect the second distribution Vth2 of the first cell A as $\{+\Delta Vt1, +\Delta Vt2, +\Delta Vt3\}$ in FIG. 4A, as $\{+\Delta Vt1, +0, +0\}$ in FIG. 4B, as $\{+0, +\Delta Vt2, +0\}$ in FIG. 4C, and as $\{+0, +0, +\Delta Vt3\}$ in FIG. 4D.

Accordingly, the controller 120 may determine that the second distribution Vth2 of the first cell A has a higher voltage range than that of the first distribution Vth1 of the second cell B. That is, the controller 120 may determine a threshold voltage relationship of A>B, and may read data values having different level (e.g., data values 01 or 10) from the first cell A and the second cell B, respectively.

Figure 5A:
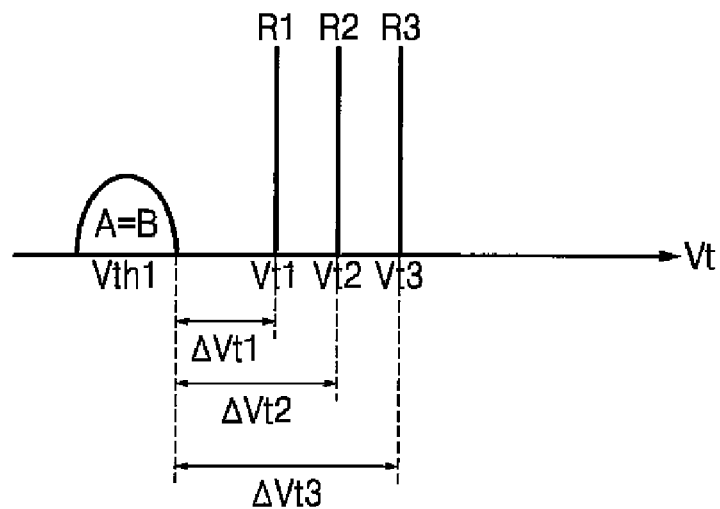
Figure 5B:
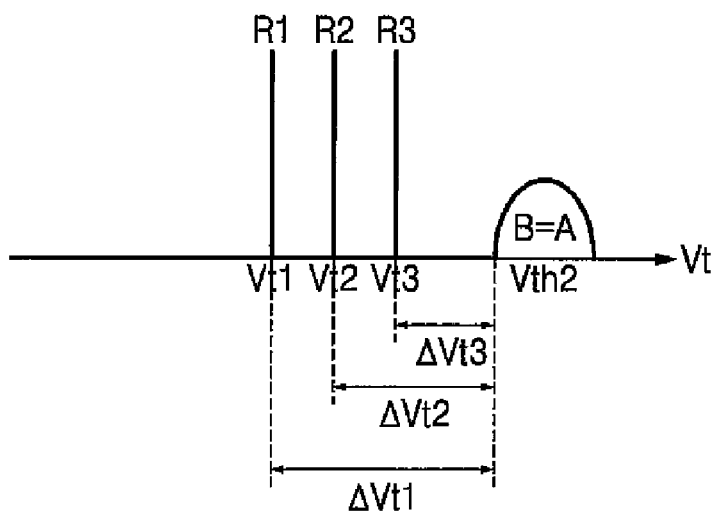

Referring to FIGS. 1, 5A and 5B, identical data is stored in a plurality of memory cells of the memory device 100, (e.g., a pair of adjacent memory cells arranged along the same word line, for example, the first cell A and the second cell B). Thus, the first and second cells A and B have substantially identical threshold voltage distributions.

In FIG. 5A, both the first cell A and the second cell B may have a first distribution Vth1. The first distribution Vth1 may have a first voltage difference $\Delta$Vt1 from the first read level R1, a second voltage difference $\Delta$Vt2 from the second read level R2, and a third voltage difference $\Delta$Vt3 from the third read level R3, where the third voltage difference $\Delta$Vt3 is greater than the second voltage difference $\Delta$Vt2, and the second voltage difference $\Delta$Vt2 is greater than the first voltage difference $\Delta$Vt1.

In FIG. 5B, both the first cell A and the second cell B may have a second distribution Vth2. The second distribution Vth2 may have a first voltage difference $\Delta$Vt1 from the first read level R1, a second voltage difference $\Delta$Vt2 from the second read level R2, and a third voltage difference $\Delta$Vt3 from the third read level R3, where the first voltage difference $\Delta$Vt1 is greater than the second voltage difference $\Delta$Vt2, and the second voltage difference $\Delta$Vt2 is greater than the third voltage difference $\Delta$Vt3.

Referring to FIG. 6, the controller 120 may detect the first distribution Vth1 of the first and second cells A and B as $\{-0, -0, -0\}$ in FIG. 5A and the second distribution Vth2 of the first and second cells A and B as $\{+0, +0, +0\}$ in FIG. 5B. Accordingly, the controller 120 may determine that the first and second cells A and B have the same distributions. That is, the controller 120 may determine that A=B, and may read data values having the same level, (e.g., 00 or 11) from the first cell A and the second cell B, respectively.

In the embodiments illustrated in FIGS. 3A-3D, 4A-4D, and 5A-5B, the x axis of each graph indicates voltage level, and the read operations are applied to the memory device 100 according to various voltage property differences between the first cell A and the second cell B. However, the scope of the inventive concept is not limited to only these embodiments. For example, the x axis of each graph may indicate a current or a resistance, and the read operations may be applied to the memory device 100 in accordance with a current property difference or a resistance property difference between the first cell A and the second cell B.

In certain embodiments of the inventive concept, operation of the controller 120 within the memory device 100 may determine a characteristic between the first cell A and the second cell B in order to obtain read data based on a defined data determination rule, and this rule may be changed by a user of host device incorporating the memory device.

Figure 7:
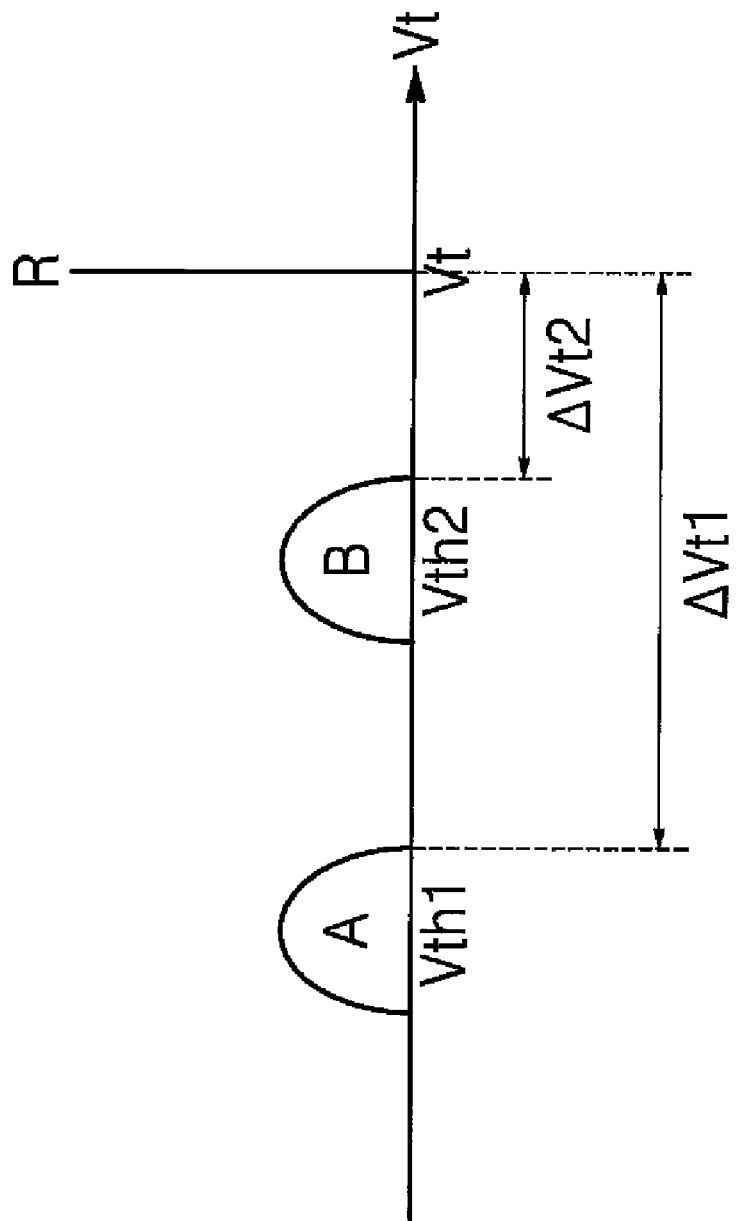
FIG. 7 is a diagram further illustrating a read operation applied to the memory device of FIG. 1 according to another embodiment of the inventive concept.

FIG. 7 is a diagram illustrating read operation for the memory device 100 according to another embodiment of the inventive concept. In FIG. 7, a single read level R is used in contrast to the plurality of read levels used in the embodiments of FIGS. 3A-3D, 4A-4D, and 5A-5B.

Referring to FIGS. 1 and 7, a plurality of memory cells in the memory device 100, (e.g., a pair of adjacent memory cells arranged along the same word line. or a first cell A and a second cell B) may store respective data having certain threshold voltage distributions. In the illustrated embodiment, the first cell A stores data having a first distribution Vth1, and the second cell B stores data having a second distribution Vth2.

The single read level R provided by the controller 120 is not overlapped by the first distribution Vth1 or the second distribution Vth2, but has a voltage level greater than the second distribution Vth2 and the first distribution Vth1, albeit the differences are relative. Thus, FIG. 7 illustrates a condition wherein the read level R has a voltage level greater than the second distribution Vth2 and much greater than the first distribution Vth1. The first distribution Vth1 of the first cell A therefore has a first voltage difference $\Delta Vt1$ from the read level R, and the second distribution Vth2 of the second cell B may have a second voltage difference $\Delta Vt2$ from the read level R.

The controller 120 may now compare the first voltage difference $\Delta Vt1$ with the second voltage difference $\Delta Vt2$, and read respective data from the first cell A and the second cell B according to the comparison result. For example, if the first voltage difference $\Delta Vt1$ is greater than or less than the second voltage difference $\Delta Vt2$, the controller 120 may determine that the first distribution Vth1 of the first cell A is lower or higher than the second distribution Vth2 of the second cell B. That is, the controller 120 may determine that A<B or A>B, and may read data values having different values, (e.g., data values 01 or 10) from the first cell A and the second cell B, respectively. On the other hand, if the first voltage difference $\Delta Vt1$ and the second voltage difference $\Delta Vt2$ are substantially equal, the controller 120 may determine that the first distribution Vth1 of the first cell A is substantially equal to the second distribution Vth2 of the second cell B (i.e., A=B), and read the same data values, (e.g., data values of 00 or 11) from the first cell A and the second cell B, respectively.

Figure 8:
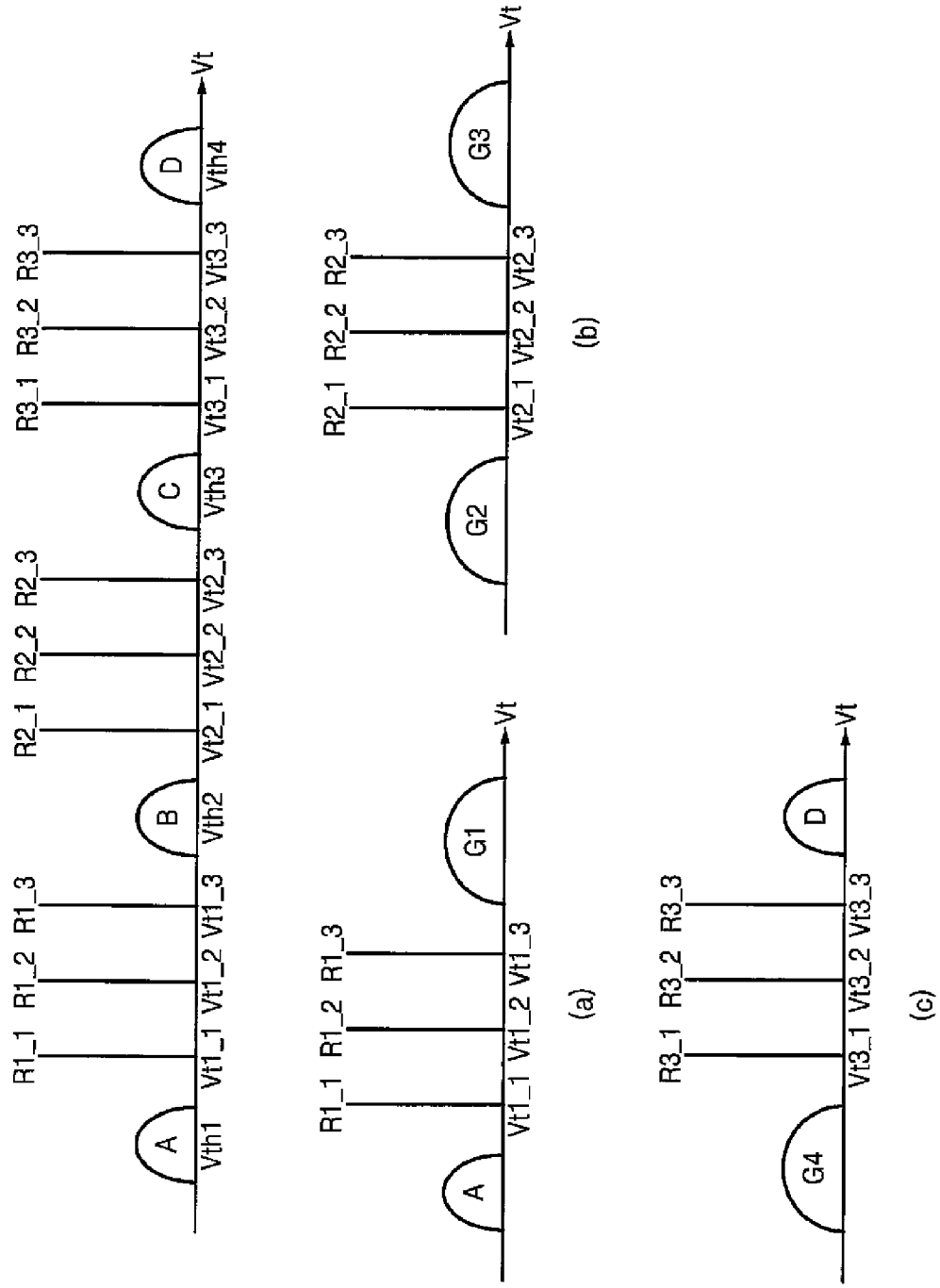
FIG. 8 inclusive of sub-drawings 8a, 8b, and 8c illustrate data read operations applied to a multi-level cell (MLC) memory device according to another embodiment of the inventive concept.

FIG. 8 illustrates data read operations applied to the memory device 100 under an assumption that memory device 100 includes MLCs according to another embodiment of the present inventive concept. FIG. 9 is a table summarizing data determination conditions according to the diagrams illustrated in FIG. 8. The embodiment illustrated in FIG. 8 is substantially the same as the read operations illustrated in FIG. 1, except for the following description.

Referring to FIG. 8, the memory device 100 includes a first cell A, a second cell B, a third cell C, and a fourth cell D having different threshold voltage distributions. As illustrated in FIG. 8(a), the controller 120 may group cells other than the first cell A, namely, the second cell B, the third cell C, and the fourth cell D, into a first group G1, determine the first cell A and the first group G1 by using a plurality of first read levels R1_1, R1_2, and R1_3, and read data from the first cell A.

As illustrated in FIG. 8(b), the controller 120 may group the first and second cells A and B into a second group G2, the third and fourth cells C and D into a third group G3, determine the second and third groups G2 and G3 by using a plurality of second read levels R2_1, R2_2, and R2_3, and read data from the second group G2. Then, the data stored in the first cell A and the second cell B may be determined by computing data read from the second group G2 according to the operation of FIG. 8(b) and data read from the first cell A according to the operation of FIG. 8(a).

As illustrated in FIG. 8(c), the controller 120 may group the first, second, and third cells A, B, and C into a fourth group G4, determine the fourth group G4 and the fourth cell D by using a plurality of third read levels R3_1, R3_2, and R3_3, and read data from the fourth group G4. Then, the data stored in the third cell C may be determined by computing data read from the fourth group G4 according to the operation of FIG. 8(c) and data read from the first and second cells A and B according to the operation of FIG. 8(b).

Thus, as illustrated in FIG. 9, the controller 120 may read data from the first cell A, the second cell B, the third cell C, and the fourth cell D, according to the determination results.

In a method of operating a memory device according to an embodiment of the inventive concept, a plurality of read levels may be effectively used to determine read data stored in memory cells with improved read margin. An increase in the read margin during read operations will reduce read errors from the memory device thereby providing reliable operation.

While the present inventive concept has been particularly shown and described with reference to exemplary embodiments thereof, it will be understood that various changes in form and details may be made therein without departing from the scope of the following claims.

What is claimed is:

1. A method of operating a memory device, the method comprising:
    defining a plurality of read levels;
    using the plurality of read levels to determine electrical properties of first and second memory cells adjacently disposed along a common word line;
    determining electrical property differences between the first and second memory cells by comparing the electrical properties of the first and second memory cells; and
    determining read data stored in the first and second memory cells based on the determination of electrical property differences between the first and second memory cells.

2. The method of claim 1, wherein the first memory cell is programmed to a first threshold distribution and the second memory cell is programmed to a second threshold distribution different from the first threshold distribution, wherein determining the electrical property difference between the first and second memory cells comprises:
    determining a voltage difference between the first threshold distribution and the second threshold distribution; and
    determining whether at least one of the plurality of read levels is captured within the voltage difference to determine the read data stored in at least one of the first and second memory cells.

3. The method of claim 1, wherein the first memory cell and the second memory cell are programmed to substantially the same threshold distribution, wherein determining the electrical property difference between the first and second memory cells comprises:
    comparing at least one of the plurality of read levels to the threshold distribution to determine the read data stored in at least one of the first and second memory cells.

4. A method of operating a memory device, the method comprising:
    defining a read level;
    using the read level to determine electrical properties of first and second memory cells adjacently disposed along a common word line;
    determining electrical property differences between the first and second memory cells by comparing the electrical properties of the first and second memory cells; and determining read data stored in the first and second memory cells based on the determination of electrical property differences between the first and second memory cells.

5. The method of claim 4, wherein the first memory cell is programmed to a first threshold distribution and the second memory cell is programmed to a second threshold distribution different from the first threshold distribution, wherein determining the electrical property difference between the first and second memory cells comprises:
   determining respective voltage differences between the read level and each one of the first threshold distribution and the second threshold distribution; and
   comparing the respective voltage difference to determine the read data stored in at least one of the first and second memory cells.

6. The method of claim 4, wherein the first memory cell and the second memory cell are programmed to substantially the same threshold distribution, wherein determining the electrical property difference between the first and second memory cells comprises:
   comparing the read level to the threshold distribution to determine the read data stored in at least one of the first and second memory cells.

7. A memory device comprising:
   a memory cell array including first and second memory cells arranged adjacent to one another along a common word line; and
   a controller configured to apply a read operation to the first and second memory cells by defining a plurality of read levels, using the plurality of read levels to determine electrical properties of the first and second memory cells, determining electrical property differences between the first and second memory cells by comparing the electrical properties of the first and second memory cells, and determining read data stored in the first and second memory cells based on the determination of electrical property differences between the first and second memory cells.

8. The memory device of claim 7, wherein the first memory cell is programmed to a first threshold distribution and the second memory cell is programmed to a second threshold distribution different from the first threshold distribution, and the controller is further configured to determine a voltage difference between the first threshold distribution and the second threshold distribution, and compare at least one of the plurality of read levels to the voltage difference to determine the read data stored in at least one of the first and second memory cells.

9. The memory device of claim 7, wherein the first memory cell and the second memory cell are programmed to substantially the same threshold distribution, and the controller is further configured to compare at least one of the plurality of read levels to the threshold distribution to determine the read data stored in at least one of the first and second memory cells.

10. The memory device of claim 7, wherein the first and second memory cells are multi-level memory cells.

* * * * *